(12) United States Patent
Mishima et al.

(10) Patent No.: US 10,405,444 B2
(45) Date of Patent: Sep. 3, 2019

(54) BICYCLE COMPONENT

(71) Applicant: Shimano Inc., Sakai, Osaka (JP)

(72) Inventors: Eiji Mishima, Osaka (JP); Takafumi Suzuki, Osaka (JP)

(73) Assignee: Shimano Inc., Osaka (JP)

( * ) Notice: Subject to any disclaimer, the term of this patent is extended or adjusted under 35 U.S.C. 154(b) by 319 days.

(21) Appl. No.: 15/182,545

(22) Filed: Jun. 14, 2016

(65) Prior Publication Data

US 2017/0034937 A1    Feb. 2, 2017

(30) Foreign Application Priority Data

Jul. 31, 2015   (JP) .................................. 2015-151745

(51) Int. Cl.
| | |
|---|---|
| *B62M 6/40* | (2010.01) |
| *H05K 5/02* | (2006.01) |
| *B62M 9/122* | (2010.01) |
| *B62M 9/132* | (2010.01) |
| *B62M 25/08* | (2006.01) |
| *B62K 19/40* | (2006.01) |
| *B62J 99/00* | (2009.01) |
| *B62M 25/00* | (2006.01) |

(52) U.S. Cl.
CPC ........... *H05K 5/0247* (2013.01); *B62K 19/40* (2013.01); *B62M 9/122* (2013.01); *B62M 9/132* (2013.01); *B62M 25/08* (2013.01); *B62J 2099/0033* (2013.01); *B62M 2025/006* (2013.01)

(58) Field of Classification Search
CPC ...... B62M 9/122; B62M 9/132; B62M 25/08; B62M 2025/006; B62K 19/40; H05K 5/0247; B62J 2099/0033

USPC ...... 180/207.3; 439/188, 331, 372, 507, 509
See application file for complete search history.

(56) References Cited

U.S. PATENT DOCUMENTS

| | | | | |
|---|---|---|---|---|
| 6,899,556 B2* | 5/2005 | Nishida | ................ | H01R 13/639 200/51.1 |
| 7,559,783 B2* | 7/2009 | Ripper | .................. | H01R 13/68 439/188 |
| 9,147,971 B2* | 9/2015 | Osada | .................. | H01R 13/639 |
| 2001/0027043 A1* | 10/2001 | Shiraki | .............. | H01R 13/7032 439/188 |
| 2002/0197897 A1* | 12/2002 | Osada | .................. | H01R 13/641 439/188 |
| 2005/0048843 A1* | 3/2005 | Iida | ..................... | H01R 13/7197 439/620.07 |
| 2011/0199757 A1* | 8/2011 | Cheng | ...................... | B60N 3/14 362/183 |
| 2011/0278086 A1* | 11/2011 | Cho | ........................ | B62M 6/90 180/220 |
| 2011/0308871 A1* | 12/2011 | Hecken | ................... | B62M 6/90 180/206.1 |

(Continued)

FOREIGN PATENT DOCUMENTS

DE    20 2013 100453 U1    2/2013

*Primary Examiner* — Toan C To
(74) *Attorney, Agent, or Firm* — Global IP Counselors, LLP

(57) ABSTRACT

A bicycle component can be attached to a bicycle body. The bicycle component basically includes a receiving part, a lid part and an electrical operating unit. The receiving part includes an opening that can receive an electrical connector. The lid part is configured to be capable of covering at least a portion of the opening. The electrical operating unit is provided to the lid part.

25 Claims, 14 Drawing Sheets

(56) References Cited

U.S. PATENT DOCUMENTS

| | | | |
|---|---|---|---|
| 2014/0170903 A1* | 6/2014 | Tuchrelo | H01R 13/7175 |
| | | | 439/620.21 |
| 2016/0016625 A1* | 1/2016 | Williams | B62M 6/55 |
| | | | 280/287 |
| 2017/0101162 A1* | 4/2017 | Tachibana | B62M 25/08 |
| 2017/0313194 A1* | 11/2017 | Carmignani | B60L 11/007 |

* cited by examiner

BICYCLE COMPONENT

CROSS-REFERENCE TO RELATED APPLICATIONS

This application claims priority to Japanese Patent Application No. 2015-151745, filed on Jul. 31, 2015. The entire disclosure of Japanese Patent Application No. 2015-151745 is hereby incorporated herein by reference.

BACKGROUND

Field of the Invention

The present invention generally relates to a bicycle component. In particular, the present invention relates to a bicycle component that can be attached to a bicycle body.

Background Information

Conventionally, (electric) components for bicycles such as electric gear shifters, electric suspension devices, and electric adjustable seat posts are known. A bicycle component is known, which can be attached to a stem of a bicycle, provided with an operating unit and a connection terminal for connecting a power storage unit for operating the (electric) component for a bicycle described above via a charging device and a cable (see for example, German Patent Utility Model No. 202013100453.7).

SUMMARY

In general, locations where a bicycle component can be attached on a bicycle body are limited. Therefore, it is required that the size of bicycle component be reduced.

The object of the present invention is to reduce the sizes of a plurality of bicycle components.

The bicycle component according to the present invention can be attached to a bicycle body. The bicycle component comprises a receiving part, a lid part, and an electrical operating unit. The receiving part includes an opening that can receive an electrical connector. The lid part is configured to be capable of covering at least a portion of the opening. The electrical operating unit is provided to the lid part.

In this bicycle component, a receiving part comprising an opening is configured to be capable of receiving an electrical connector. And an electrical operating unit is provided to a lid part that covers at least a portion of the opening. That is, since a receiving part and an electrical operating unit can be disposed so that one overlaps the other, it is possible to reduce the size of the bicycle component.

The electrical connector is a plug, and the receiving part can comprise a socket that can be electrically connected to a plug. According to this configuration, an additional bicycle component (described in detail below) that is attached to the bicycle body and an external device (for example, a personal computer, a power source, or the like) can be electrically connected only by inserting the plug into the socket.

The electrical operating unit can comprise at least one switch that can be pressed. According to this configuration, since the switch can be turned on/off by a pressing operation, it is possible to operate the switch easily.

The electrical operating unit can comprise an installation part in which at least one switch is installed. According to this configuration, for example, by forming the installation part from a hard material such as metal, the switch can be stably pressed even if the switch is disposed in a soft housing.

The electrical operating unit can comprise at least one pressing portion for pressing at least one switch. According to this configuration, since the switch can be pressed via a pressing portion, it is possible to operate the switch more easily.

At least one pressing portion can be disposed outside of the lid part, and at least one switch can be disposed inside the lid part. According to this configuration, since a switch is provided inside the lid part, the switch can be electrically insulated.

The lid part can be configured to be capable of being disposed in a first position, and in a second position which is different from the first position. The receiving part can be configured so that at least a portion of the opening is covered by the lid part if the lid part is disposed in the first position, and so that the electrical connector can be received via the opening if the lid part is disposed in the second position. According to this configuration, since the lid part moves between the first position and the second position, the lid part can be easily opened and closed.

The lid part can include a sealing portion that is capable of sealing the opening. According to this configuration, the receiving part that is provided in the opening can be electrically insulated.

If the lid part is disposed in the first position, the sealing portion of the lid part can be configured to seal the opening. According to this configuration, since the opening can be sealed by the lid part, the sealing structure can be simplified.

The bicycle component can further comprise a supporting structure that movably supports the lid part. According to this configuration, since the lid part is movably supported via the supporting structure, the lid part can be sealed more easily.

The lid part can be made of an elastic material. According to this configuration, the lid part is returned to the original position by elasticity, even if the lid part is bent to expose the opening of the receiving part.

The lid part can be made of a non-metallic material. According to this configuration, the shape of the lid part will have a high degree of freedom.

The bicycle component can further comprise an attaching portion for attaching the bicycle component to an attaching recess provided on the bicycle body. According to this configuration, the bicycle component can be attached to the attaching recess in a state in which a receiving part and a lid part are provided to the attaching portion. The bicycle component can thereby be easily attached to the bicycle body.

The bicycle component can further comprise a sealing structure that is capable of sealing the gap between the attaching recess and the attaching portion. According to this configuration, foreign matter such as liquid will not easily intrude into the bicycle body between the attaching portion and the attaching recess.

The attaching recess can be disposed in a hollow member of the bicycle body. At least a portion of the attaching portion can be disposed inside the bicycle body. According to this configuration, since at least a portion of the attaching portion is disposed inside the bicycle body, the attaching portion is less likely to be exposed from the bicycle body.

The sealing structure can be disposed on the attaching portion.

The attaching recess can be disposed in at least one of a handlebar and a frame, which are hollow members. At least a portion of the attaching portion can be disposed inside at least one of the frame and the handlebar.

The attaching portion can be attached to the attaching recess by at least one attachment method from among locking, press-fitting, adhesion, snap-fitting, and screwing.

The bicycle component can further comprise an output unit that is electrically connected to the receiving part and the electrical operating unit. According to this configuration, an operation signal of the electrical operating unit and a signal and/or power that is received by the receiving part can be output to an additional bicycle component that is different from the bicycle component.

When receiving an input from the electrical operating unit, the output unit is further configured to output a mode transition signal to the additional bicycle component. According to this configuration, the mode of the additional bicycle component can be transitioned by operating the electrical operating unit.

The receiving part can be configured to be capable of receiving signals via an electrical connector, and the output unit is further configured to output a signal from the receiving part to an additional bicycle component. According to this configuration, signals from an external device, including communication terminal devices such as personal computers, tablet type computers, and smartphones, can be output to an additional bicycle component.

The additional bicycle component can be a bicycle transmission device. According to this configuration, operation and control of a bicycle transmission device can be performed via the bicycle component.

The receiving part can be configured to be capable of receiving power via an electrical connector, and the output unit is further configured to output power from the receiving part to an additional bicycle component. According to this configuration, power can be supplied to an additional bicycle component via the bicycle component.

The additional bicycle component can be a bicycle power supply device that can be charged. According to this configuration, the bicycle power supply device can be charged via the bicycle component.

The bicycle component can further comprise a display unit that is configured to display the operating state. According to this configuration, the user is easily able to grasp the operating state of at least one of the bicycle component and the additional bicycle component.

The bicycle component can further comprise a wireless communication unit that is capable of executing at least one of wireless transmission and wireless reception.

According to the present invention, it is possible to reduce the size of a bicycle component.

BRIEF DESCRIPTION OF THE DRAWINGS

Referring now to the attached drawings which form a part of this original disclosure.

DETAILED DESCRIPTION OF EMBODIMENTS

Selected embodiments will now be explained with reference to the drawings. It will be apparent to those skilled in the bicycle field from this disclosure that the following descriptions of the embodiments are provided for illustration only and not for the purpose of limiting the invention as defined by the appended claims and their equivalents.

First Embodiment

Figure 1:
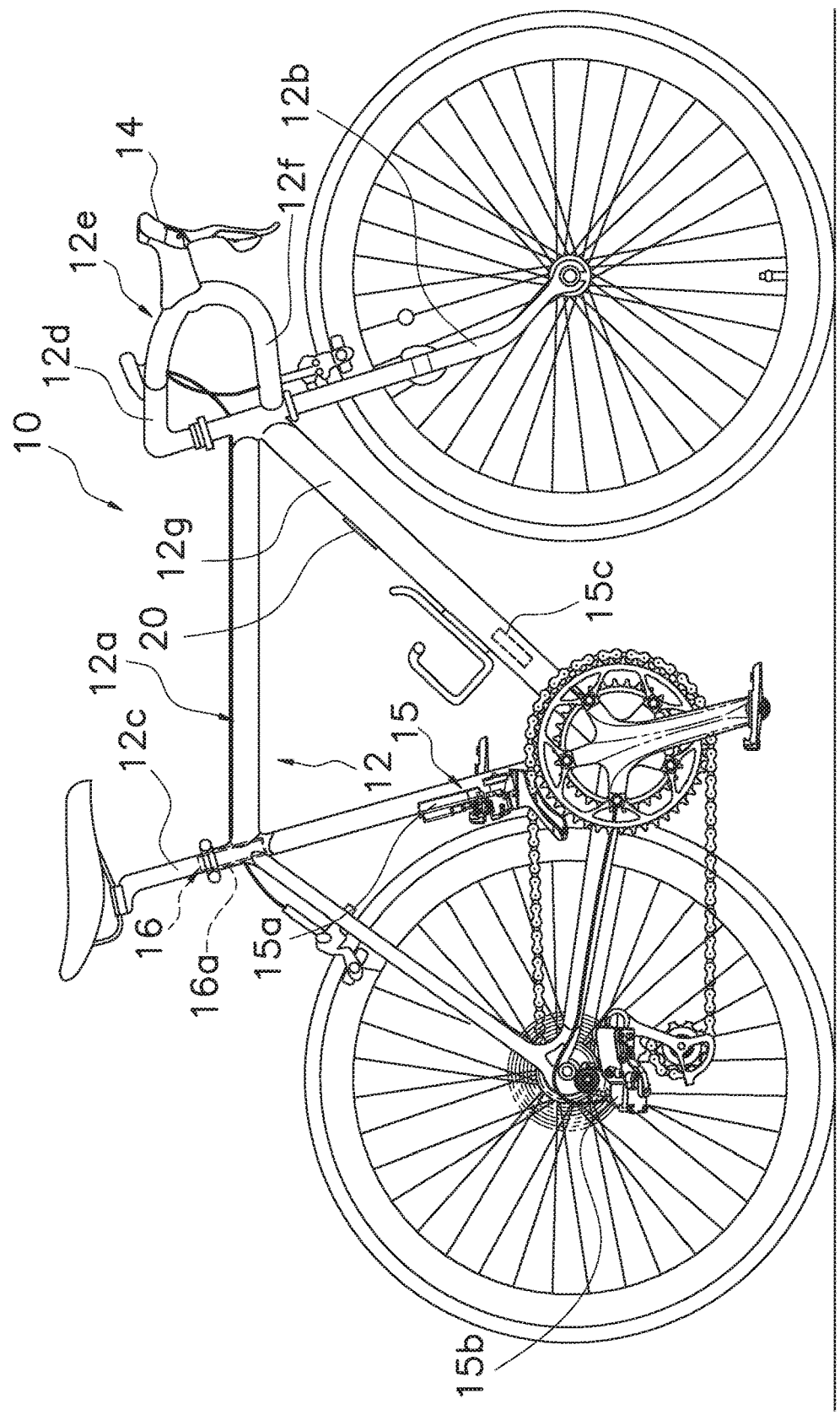
FIG. 1 is a side elevational view of a bicycle which is equipped with a bicycle component according to a first embodiment.

A first embodiment of the present invention will be described with reference to FIGS. 1 to 6. In FIG. 1, a bicycle component 20 according to the first embodiment of the present invention can be attached to a bicycle body 12 of a bicycle 10. The bicycle body 12 is a hollow member that comprises at least one of a frame 12a and a handlebar 12e. The bicycle body 12 is a hollow member that more preferably comprises at least one of a front fork 12b, a seat post 12c, and a handle stem 12d. In the first embodiment, the handlebar 12e is a hollow drop handlebar having a curved portion 12f that is curved in a U-shape at both ends thereof. The handlebar 12e can be any handlebar that is hollow, and can be a hollow bicycle handlebar having a shape that is different from a drop handlebar. For example, the handlebar 12e can be a hollow flat handlebar, or a hollow up handlebar. The bicycle 10 further comprises a bicycle transmission device 15 that can be electrically controlled. The bicycle transmission device 15 preferably comprises at least one of an electric front derailleur 15a that is mounted in a central portion of the frame 12a and an electric rear derailleur 15b that is mounted in a rear portion of the frame 12a. More preferably, the bicycle transmission device 15 comprises a transmission controller 15c configured to be capable of transmitting a shift control signal to at least one of the electric front derailleur 15a and the electric rear derailleur 15b based on an input from at least one shift operation device 14 that is mounted on the handlebar 12e. The bicycle 10 further comprises a bicycle power supply device 16 that can be charged. Preferably, the bicycle power supply device 16 comprises a power supply unit 16a that is housed inside the seat post 12c. The bicycle transmission device 15 and the bicycle power supply device 16 are examples of additional bicycle components, described below.

Figure 2:
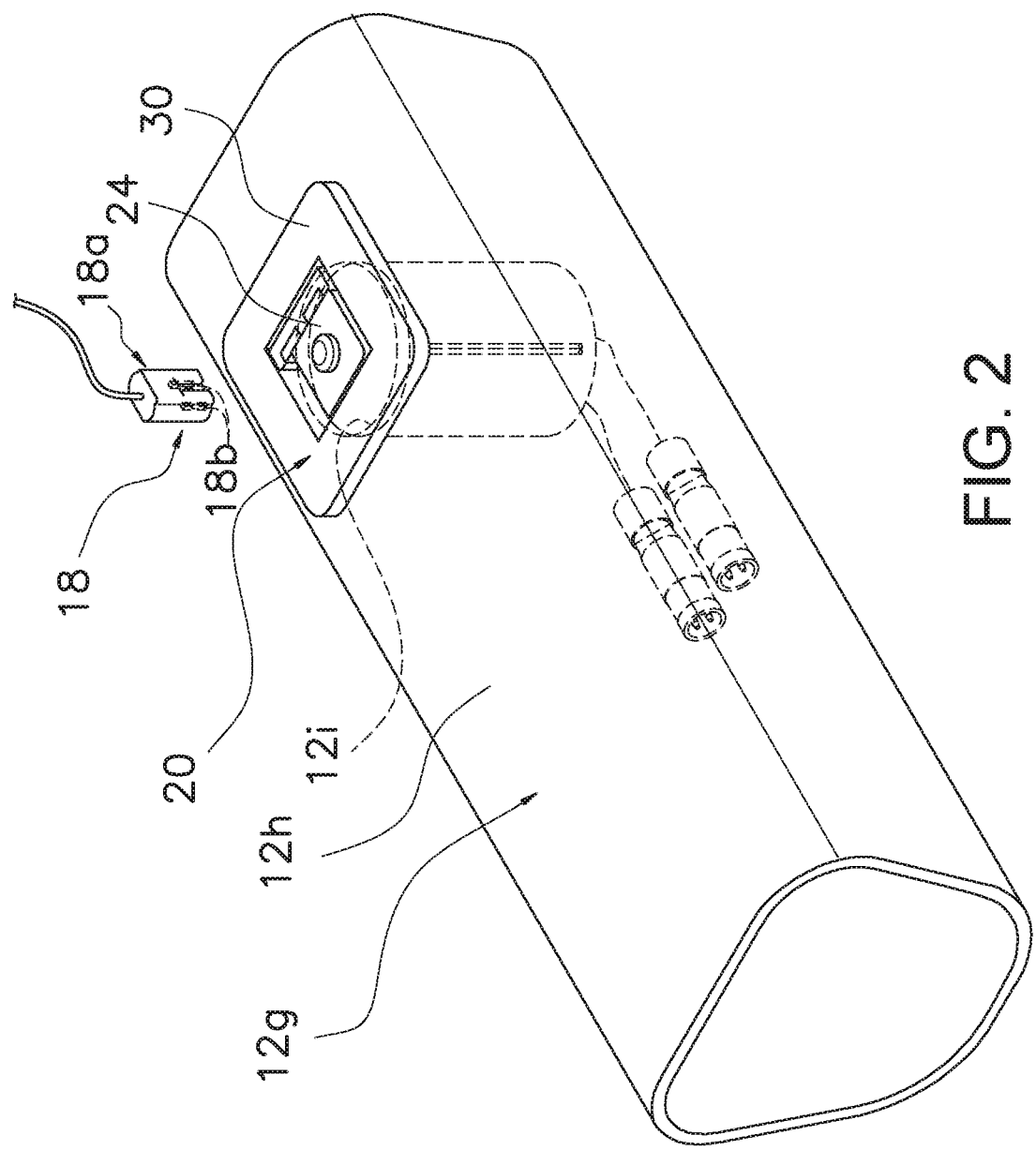
FIG. 2 is a perspective view showing a state in which the bicycle component according to the first embodiment is mounted on a bicycle body.

As shown in FIG. 2, the bicycle component 20 according to the first embodiment is attached to a downtube 12*g* of the frame 12*a* of the bicycle body 12. Specifically, at least a portion of the bicycle component 20 is attached to an attaching recess 12*i* formed by notching the outer side surface 12*h* of the downtube 12*g*. In the first embodiment, the attaching recess 12*i* is circular. The bicycle component 20 can receive an electrical connector 18 that is electrically connected to an external device. The electrical connector 18 comprises a plug 18*a*. The plug 18*a* comprises a pair of connection terminals 18*b* with, for example, a rectangular or a circular cross section at the distal end thereof. External devices include communication terminal devices such personal computers, tablet type computers, and smartphones.

Figure 6:
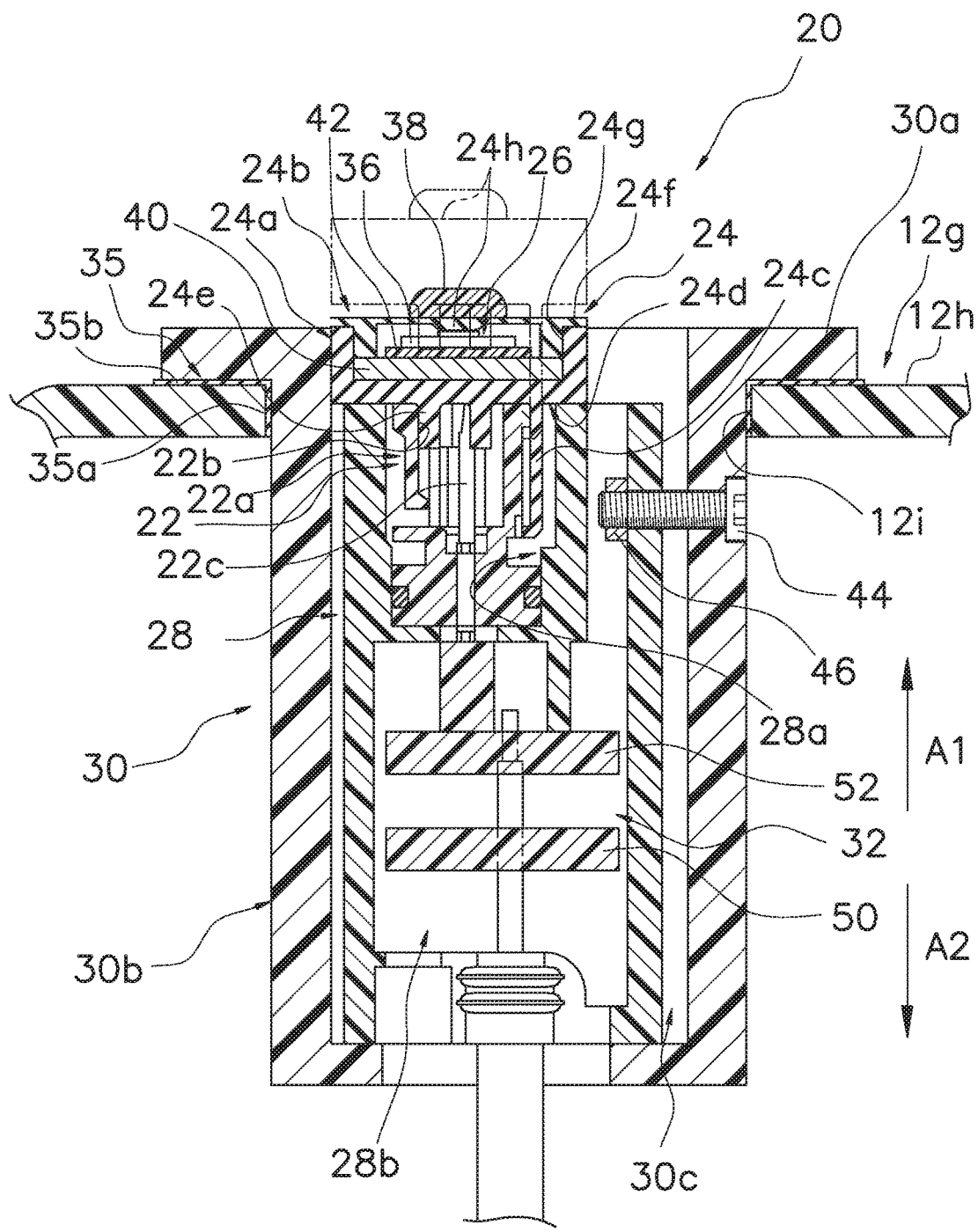
FIG. 6 is a cross-sectional view taken along the section line IV-IV in FIG. 3.

As shown in FIG. 3 to FIG. 6, the bicycle component 20 comprises a receiving part 22, a lid part 24 and an electrical operating unit 26 (refer to FIG. 6). The bicycle component 20 further comprises an attaching portion 30, an output unit 32, a display unit 34 and a sealing structure 35. Meanwhile, in the following descriptions, the A1 direction is a direction from inside the downtube 12*g* toward the outer side surface 12*h*, and a direction that is substantially parallel to the longitudinal direction of the bicycle component 20, while the A2 direction is a direction opposing the A1 direction.

The receiving part 22 receives power via the electrical connector 18, and the output unit 32 outputs power from the receiving part 22 to an additional bicycle component. The receiving part 22 includes an opening 22*b* that can receive the electrical connector 18. The receiving part 22 comprises a socket 22*a* that can be electrically connected to the plug 18*a*. The socket 22*a* comprises a pair of connecting pins 22*c*, which extend from the bottom portion of the socket 22*a* toward the lid part 24, that is, which extend along the A1 direction. The connecting pins 22*c* are electrically connected to the output unit 32. Furthermore, the connecting pins 22*c* are configured to be capable of being inserted into a pair of connection terminals 18*b*. The socket 22*a* is electrically connected to the plug 18*a* when the connecting pins 22*c* is inserted into the connection terminals 18*b*. The opening 22*b* has a shape that allows engagement with the outer peripheral surface of the electrical connector 18. The receiving part 22 comprises a supporting structure 22*d* that movably supports a leg portion 24*c* of the lid part 24, described below.

The lid part 24 is configured to be capable of covering at least a portion of the opening 22*b*. In the first embodiment, the lid part 24 is configured to be capable of covering the entire upper surface of the receiving part 22. The lid part 24 covers the opening 22*b*. The lid part 24 is configured to be capable of being disposed in a first position as indicated by the solid lines in FIG. 6, that is, the closed position. The lid part 24 is configured to be capable of being disposed in a second position as indicated by the chain double-dashed line. The second position is different from the first position, that is, the open position. The receiving part 22 is configured so that at least a portion of the opening 22*b* is covered by the lid part 24 if the lid part 24 is disposed in the first position. The receiving part 22 is also configured so that the electrical connector 18 can be received via the opening 22*b* if the lid part 24 is disposed in the second position.

The lid part 24 comprises a lid main body 24*a* and a cover member 24*b*. The lid main body 24*a* has one end surface 24*f* that is formed in a rectangular frame shape. The cover member 24*b* covers the one end surface 24*f* of the lid main body 24*a*. The lid main body 24*a* is configured to be capable of forming a rectangular space therein. The lid main body 24*a* comprises a leg portion 24*c* that extends from the bottom portion 24*d* to the receiving part 22, that is, that extends along the A2 direction. The lid main body 24*a* comprises a sealing portion 24*e* that extends toward the receiving part 22, that is, that extends along the A2 direction. The leg portion 24*c* is integrally formed with the lid main body 24*a*. The sealing portion 24*e* is integrally formed with the lid main body 24*a*. The leg portion 24*c* is supported by the supporting structure 22*d* of the receiving part 22 so as to be movable in each of the A1 direction and the A2 direction. The lid part 24 is thereby movable with respect to the receiving part 22. Specifically, the leg portion 24*c* is supported by the supporting structure 22*d* of the receiving part 22 so as to be movable in each of the A1 direction and the A2 direction. Therefore, the lid part 24 is capable of moving in each of the A1 direction and the A2 direction, with respect to the receiving part 22. Furthermore, the leg portion 24*c* is retained by the supporting structure 22*d*. That is, the movement amount in the A1 direction and the movement amount in the A2 direction of the lid part 24 with respect to the receiving part 22 are limited by the supporting structure 22*d*. The sealing portion 24*e* is formed to engage elastically with the opening 22*b* and to protrude from the center part of the bottom portion 24*d*. If the lid part 24 is disposed in the first position, the sealing portion 24*e* is configured to engage elastically with the opening 22*b* in order to seal the opening 22*b*. Furthermore, if the lid part 24 is disposed in the first position, then the sealing portion 24*e* is configured so that the lid part 24 maintains the elastically engaged state with the opening 22*b* to seal the opening 22*b*. Accordingly, if the lid part 24 is disposed in the first position, then the lid part 24 is not easily opened by vibration or the like.

The cover member 24*b* is configured to engage with the one end surface 24*f* and the inner side surface 24*g* of the lid main body 24*a*. The inside of the lid part 24 can thereby be sealed. A protrusion 24*h* is formed in the center part of the rear surface of the cover member 24*b*, and protrudes toward the bottom portion 24*d*. That is, the protrusion 24*h* protrudes in the A2 direction. The protrusion 24*h* is provided to operate the electrical operating unit 26. The lid main body 24*a* and the cover member 24*b* are made from, for example, a soft synthetic resin elastic material such as a polyester-based thermoplastic elastomer, or the like. That is, the lid part 24 is made from an elastic material. Alternatively, the lid part 24 can be made from a non-metallic material.

The electrical operating unit 26 is provided on the lid part 24. The electrical operating unit 26 includes at least one switch 36 that can be pressed, at least one pressing portion 38 for pressing at least one switch 36, and an installation part 40. For example, at least one switch 36 includes a tact switch that can be pressed and that is disposed inside the lid part 24. In the first embodiment, the electrical operating unit 26 includes, but is not limited to, one switch 36, and can also include a plurality of switches 36. The switch 36 is surface-mounted on a switch board 42 which is attached to the installation part 40. The switch board 42 is electrically connected to the output unit 32 by an electrical wire that passes inside a wire cover 43.

The pressing portion 38 is made from, for example, a soft synthetic resin material such as polycarbonate. The pressing portion 38 is configured so that at least one switch 36 can be pressed. The pressing portion 38 is disposed outside the lid part 24. Specifically, the pressing portion 38 is disposed on the surface of the cover member 24*b* (the surface that is oriented in the A1 direction). More specifically, the pressing portion 38 is disposed to be aligned with the protrusion 24*h* of the cover member 24*b* along the A1 direction (or the A2 direction). In the first embodiment, the pressing portion 38 includes, but is not limited to, a circular pushbutton, and can also include any appropriately shaped pushbutton. The pressing portion 38 is fixed to the cover member 24b by an appropriate bonding means, such as adhesion. The installation part 40 is configured so that a switch 36 can be disposed therein. The installation part 40 is disposed on the entire surface of the bottom portion 24d of the lid main body 24a. The installation part 40 is a member made of a metal material or a hard synthetic resin material. The material of the installation part 40 has a greater hardness than the soft synthetic resin material used for the lid main body 24a and the cover member 24b. Accordingly, the installation part 40 is capable of restricting the movement of the switch toward the receiving part 22, that is, movement in the A2 direction, when the user presses the pressing portion 38.

When electrically connecting an external device to the bicycle component 20, the user moves the lid part 24 in the A1 direction to dispose same in the second position, then moves the lid part 24 to the display unit 34 side. Accordingly, the leg portion 24c is bent, and the lid main body 24a is separated from the receiving part 22. The user is thereby able to connect the electrical connector 18 to the receiving part 22 via the opening 22b.

As shown in FIG. 6, the support portion 28 is a cuboidal synthetic resin material having a first space 28a and a second space 28b. The first space 28a and the second space 28b each has a rectangular cross section. The first space 28a is opened on the lid part 24 side and the receiving part 22 is housed therein. The second space 28b is formed below and on the side of the first space 28a in FIG. 6. The support portion 28 supports the socket 22a of the receiving part 22, the output unit 32, and the display unit 34. The portion of the support portion that supports the display unit 34 is formed so that the height is higher than the other portions, so as to be capable of protruding from the attaching portion 30. The support portion 28 is fixed to the attaching portion 30 by a bolt member 44 and a nut member 46. In the first embodiment, the receiving part 22 comprises a supporting structure 22d, but the invention is not limited thereto, and the support portion 28 can comprise the supporting structure 22d. Specifically, the leg portion 24c of the lid part 24 can be movably supported in a recess 28c of the support portion 28. In this case, the recess 28c can be considered as a supporting structure 22d.

Figure 3:
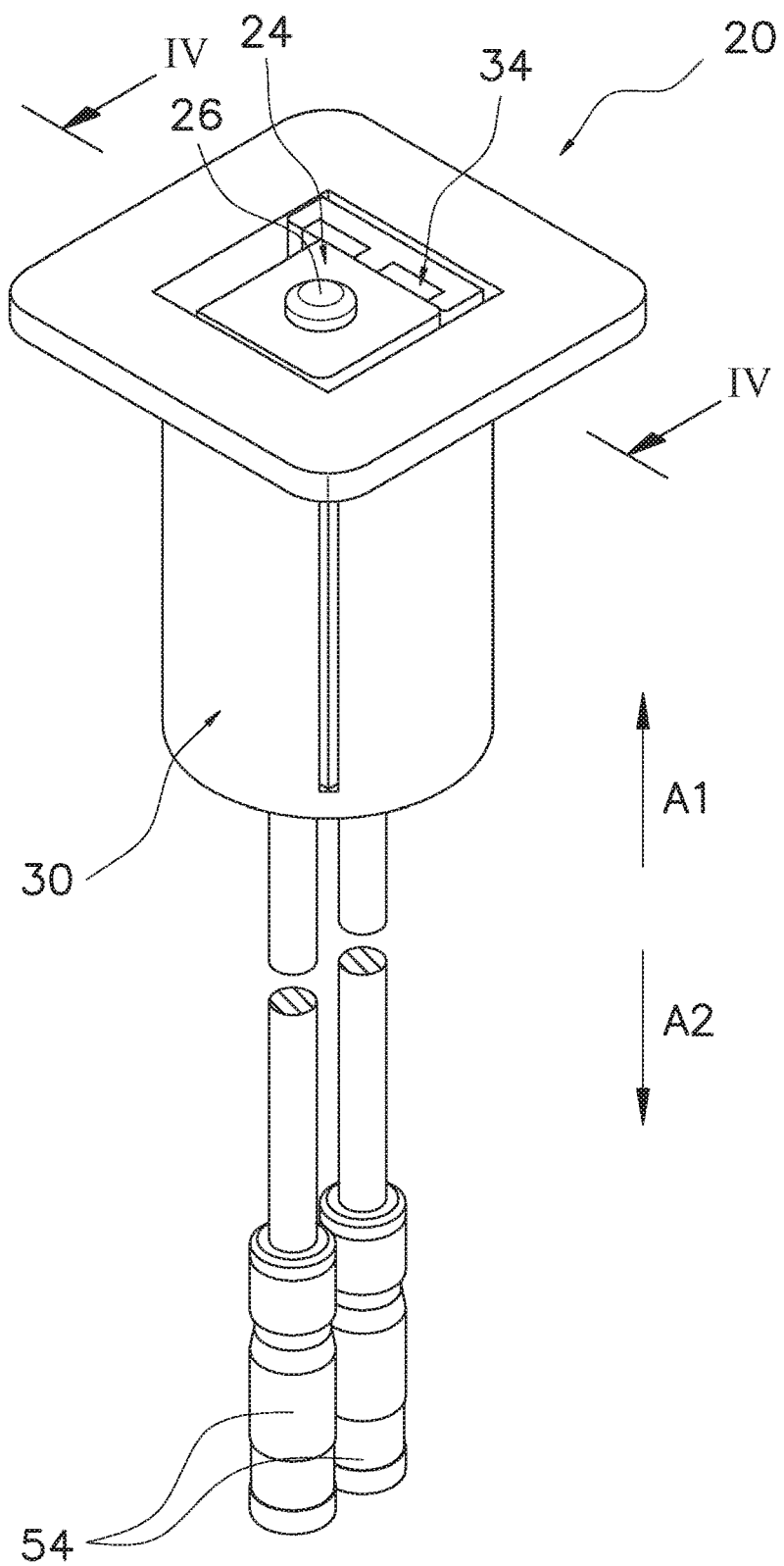
FIG. 3 is a perspective view of the bicycle component according to the first embodiment.

As shown in FIGS. 2 and 3, the attaching portion 30 is for attaching the bicycle component 20 to an attaching recess 12i provided to a downtube 12g of the frame 12a. At least a portion of the attaching portion 30 can be disposed inside the downtube 12g. The attaching portion 30 can be attached to the attaching recess 12i by at least one attaching method from among locking, press-fitting, adhesion, snap-fitting, and screwing. In the first embodiment, the attaching portion 30 is adhered to the attaching recess 12i by a seating structure 35. The attaching portion 30 comprises a rectangular plate-like flange 30a and a cylindrical main body portion 30b, which is attached to the attaching recess 12i. A space 30c is formed in the main body portion 30b. The space 30c has a rectangular cross section.

The output unit 32 is electrically connected to the electrical operating unit 26 and the receiving part 22. The output unit 32 outputs a signal from the electrical operating unit 26 and a signal and/or power from the receiving part 22 to an additional bicycle component that is different from the bicycle component 20. Specifically, when receiving an input from the electrical operating unit 26, the output unit 32 is configured to output a mode transition signal (described in detail below) to the additional bicycle component. At this time, the additional bicycle component is a bicycle transmission device 15. On the other hand, the receiving part 22 is configured to be capable of receiving power via the electrical connector 18, and the output unit 32 is configured to output the power from the receiving part 22 to the additional bicycle component. At this time, the additional bicycle component is a bicycle power supply device 16 which can be charged. In the first embodiment, the additional bicycle component includes, but is not limited to, the above-described bicycle transmission device 15 and bicycle power supply device 16, and can also include a bicycle suspension device, a bicycle adjustable seat post device, and a bicycle drive unit device for assisting the manual drive force.

The output unit 32 communicates with the additional bicycle component by prescribed wired communication standards. In the first embodiment, the output unit communicates with other components by a standard in compliance with the power line communication (Power Line Communication: PLC) standard, utilizing a two-core power line. The output unit 32 comprises a switch signal generating substrate 50, a power line communication substrate 52, and at least one output terminal 54. In the first embodiment, the output unit 32 comprises two output terminals 54 (refer to FIG. 3), but is not limited thereto, and can comprise a single, or three or more output terminals 54.

The switch signal generating substrate 50 is electrically connected to the switch 36 and converts the output of the switch 36 into signals. For example, when receiving input from the electrical operating unit 26, the switch signal generating substrate 50 outputs a mode transition signal to the bicycle transmission device 15, which is an additional bicycle component. The bicycle transmission device 15 is capable of being operated in a plurality of operation modes. The bicycle transmission device 15 is configured to change the operation mode from the current operation mode to another operation mode that is different from the current operation mode when receiving a mode transition signal. In the first embodiment, the mode transition signal is a signal for transitioning the operation mode of the bicycle transmission device 15 to a front adjustment mode for fine adjustment of the position of an electric front derailleur 15a. However, the mode transition signal is not limited to a signal for transitioning the bicycle transmission device 15 to a front adjustment mode, and can be a signal for transitioning to at least one operation mode from among a rear adjustment mode for fine adjustment of the position of the electric rear derailleur 15b, a manual shift mode for independently executing the shifting operation of each of the electric front derailleur 15a and the electric rear derailleur 15b, and a synchro shift mode for executing each shifting operation of the electric front derailleur 15a and the electric rear derailleur 15b in cooperation.

The power line communication substrate 52 is electrically connected to the switch signal generating substrate 50 and the output terminal 54. The power line communication substrate 5 modulates the input/output signals to power line communication standard signals, and decodes the power line communication standard signals. The output terminal 54 inputs/outputs the power line communication standard signals which are superimposed on the power to the additional component.

The display unit 34 is configured to display the operating state. In the first embodiment, the display unit 34 displays the operating state of the additional bicycle component. The display unit 34 comprises two light-emitting diodes 34a. In the first embodiment, the display unit 34 displays the operating mode of the bicycle transmission device 15, which is an additional bicycle component, or the remaining amount of power of the bicycle power supply device 16, by at least one method from among, for example, turning on, turning off, blinking, and changing colors (for example, from blue to red). The display unit 34 can comprise one or three or more light-emitting diodes 34a, or, comprise either a liquid-crystal display or an audio output unit instead of the two light-emitting diodes 34a.

As shown in FIG. 6, the sealing structure 35 is a synthetic resin elastic body comprising synthetic rubber, in which an adhesive layer having adhesiveness is formed on both surfaces thereof (that is, a double-sided tape). The sealing structure 35 is capable of sealing the gap between the attaching portion 30 and the attaching recess 12i. The sealing structure 35 comprises a tubular portion 35a that is disposed between the attaching portion 30 and the attaching recess 12i, and a flange portion 35b that is disposed between the outer side surface 12h of the downtube 12g and the attaching portion 30. Whereas, in the first embodiment, the sealing structure 35 comprises both a function to seal the gap between the attaching portion 30 and the attaching recess 12i, and a function to fix the attaching portion 30 to the outer side surface 12h of the downtube 12g, the sealing structure 35 can also be configured to have only one of the two functions described above. In addition, in the first embodiment, the sealing structure 35 comprises both a tubular portion 35a and a flange portion 35b, but the sealing structure 35 can be configured to comprise only one thereof.

In the bicycle component 20 according to the first embodiment, a power source unit 16a can be charged by opening the opening 22b by disposing the lid part 24 in the second position and moving same to the display unit 34 side, and electrically connecting a charging device as an external device to the socket 22a via the electrical connector 18. Furthermore, the setting of the bicycle transmission device 15 can be changed, or the firmware can be updated, by electrically connecting a computer or a communication terminal as an external device to the socket 22a via the electrical connector 18. Furthermore, an operation test of the bicycle transmission device 15 can be carried out.

Second Embodiment

Next, the second embodiment of the present invention will be described with reference to FIGS. 7 to 10. In the following descriptions, the same configurations as the first embodiment are given the same reference symbols as the first embodiment, and the descriptions thereof are omitted.

Figure 7:
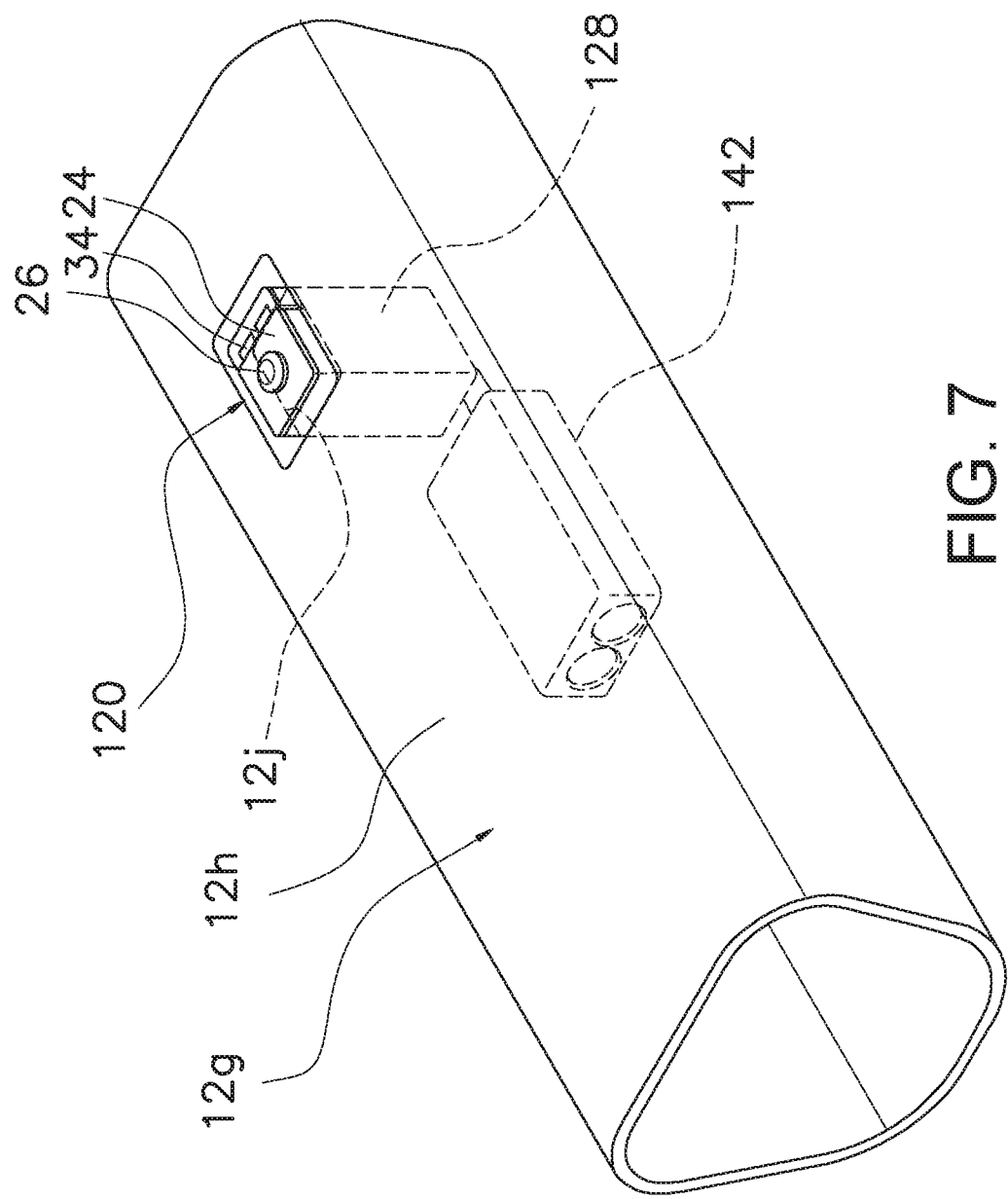
FIG. 7 is a perspective view showing a state in which the bicycle component according to the second embodiment is mounted on a bicycle body.
Figure 8:
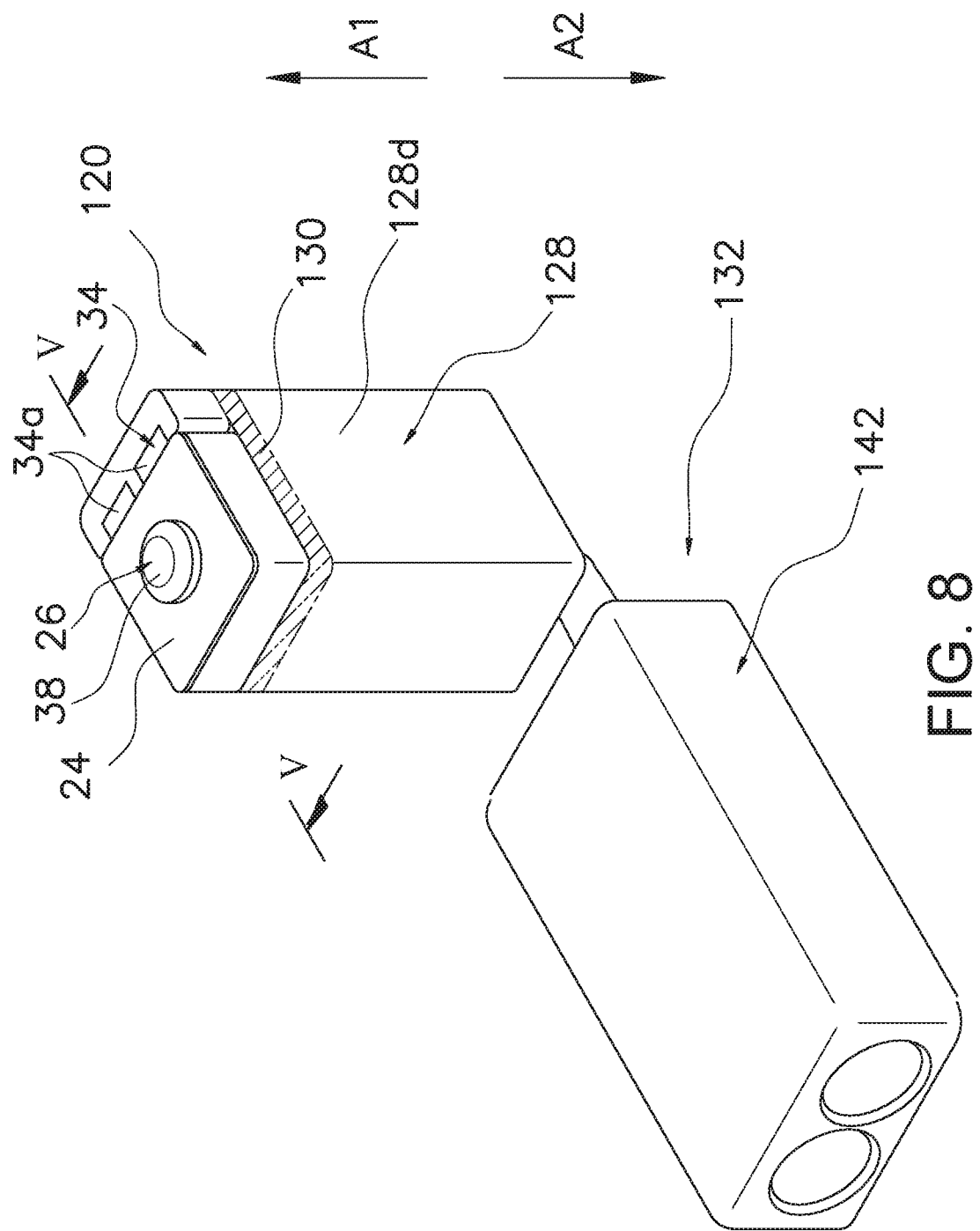
FIG. 8 is a perspective view of the bicycle component according to the second embodiment.

As shown in FIGS. 7 and 8, in the bicycle component 120 of the second embodiment, the area of the outer side surface 128d of the support portion 128 indicated by the chain double-dashed line functions as an attaching portion 130. The attaching portion 130 is attached to the attaching recess 12j by a sealing structure 135 formed by coating a silicone rubber adhesive. Unlike the attaching recess 12i of the first embodiment, the attaching recess 12j is disposed in a position that is recessed from the outer side surface 12h of the downtube 12g (toward the A2 direction). Furthermore, unlike the attaching recess 12i of the first embodiment, the attaching recess 12j is rectangular so as to be engageable with the outer side surface 128d of the support portion 128. According to this configuration, the protrusion amount of the lid part 24 from the outer side surface 12h can be suppressed. Meanwhile, the attaching recess 12j can be formed by simply notching out the outer side surface 12h in a rectangular shape.

Figure 4:
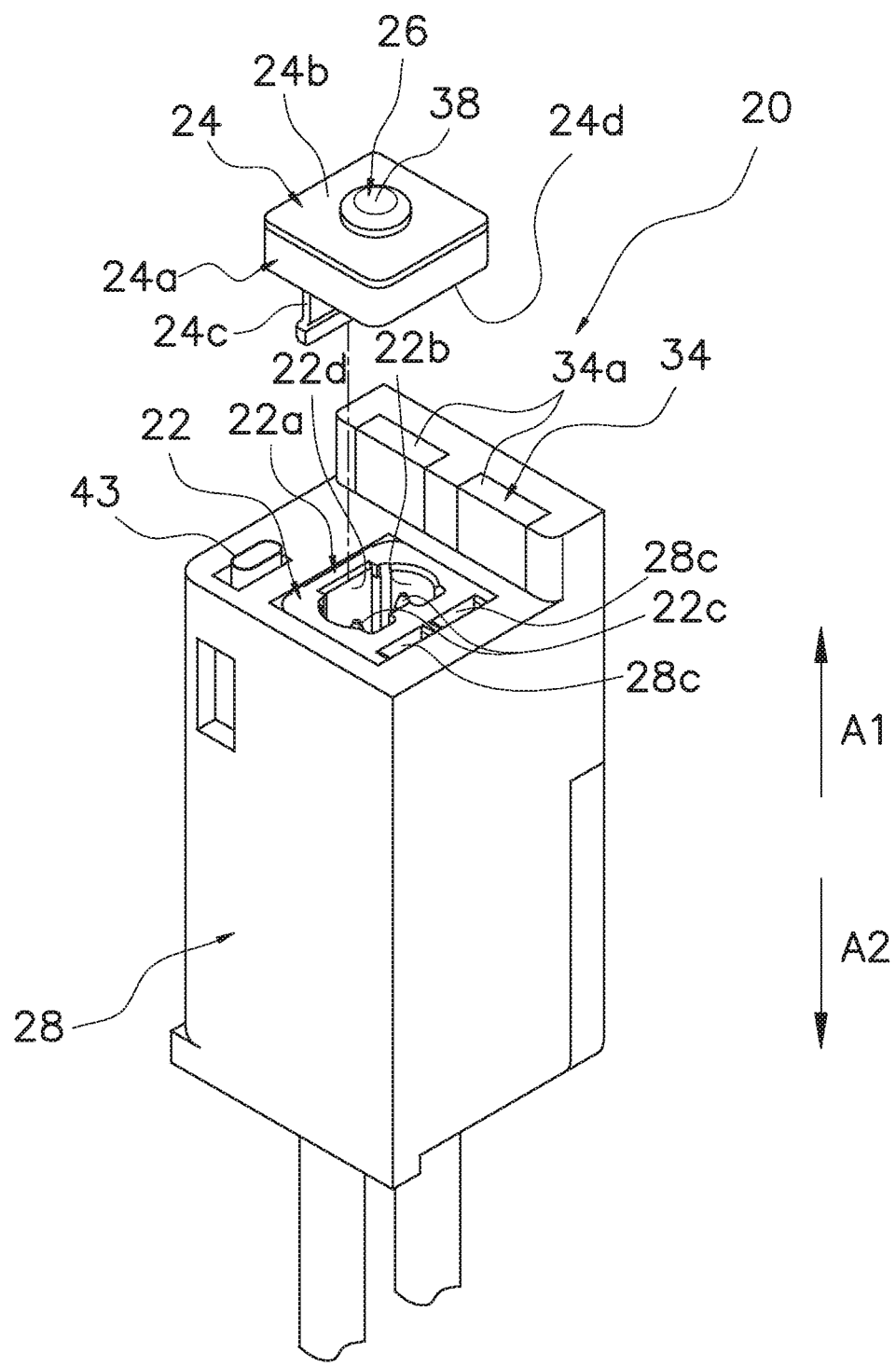
FIG. 4 is an exploded perspective view of a bicycle component in a state in which the attaching portion of the bicycle component according to the first embodiment is removed.
Figure 5:
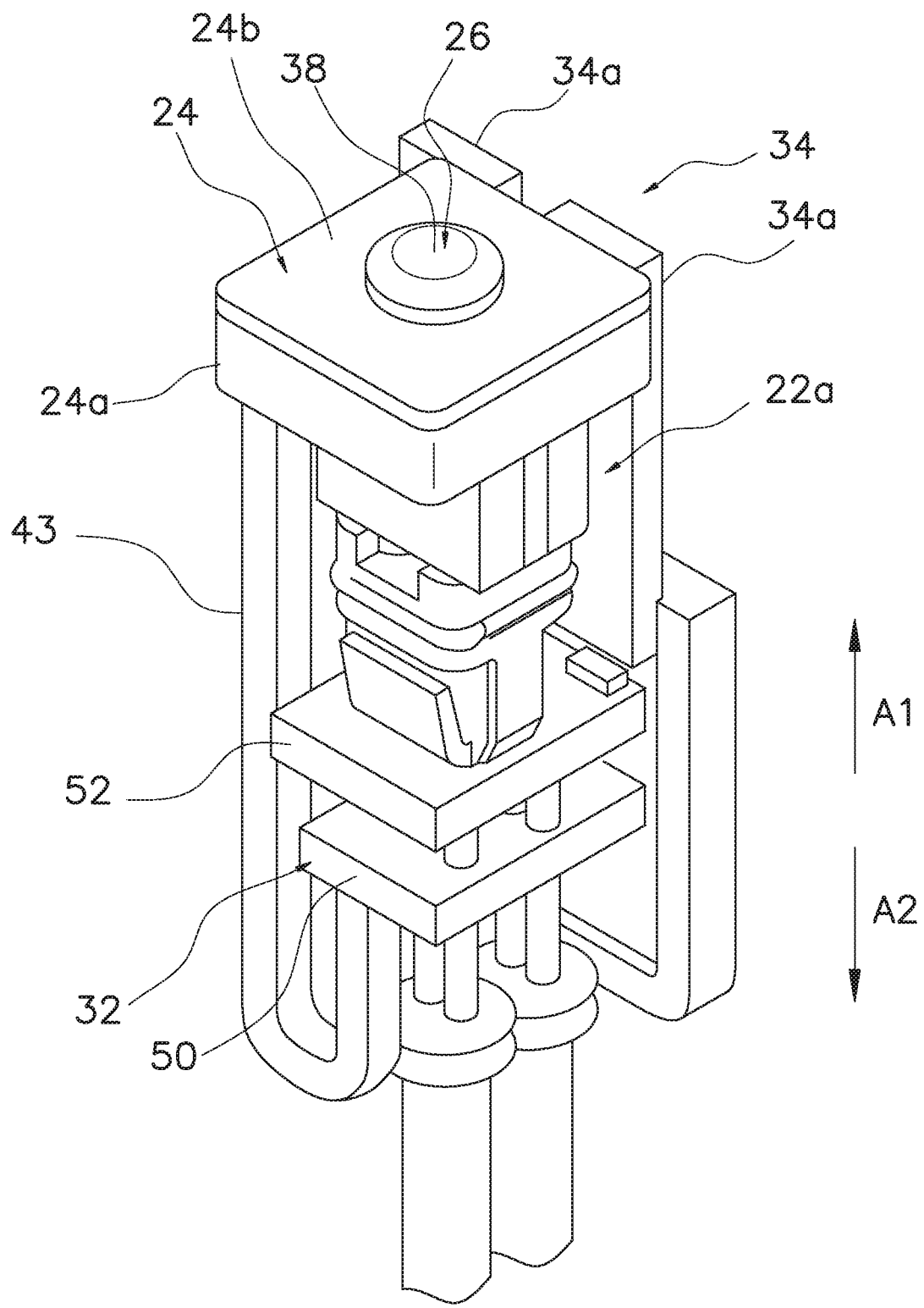
FIG. 5 is a perspective view of a bicycle component in a state in which the attaching portion and the supporting portion of the bicycle component according to the first embodiment are removed.
Figure 9:
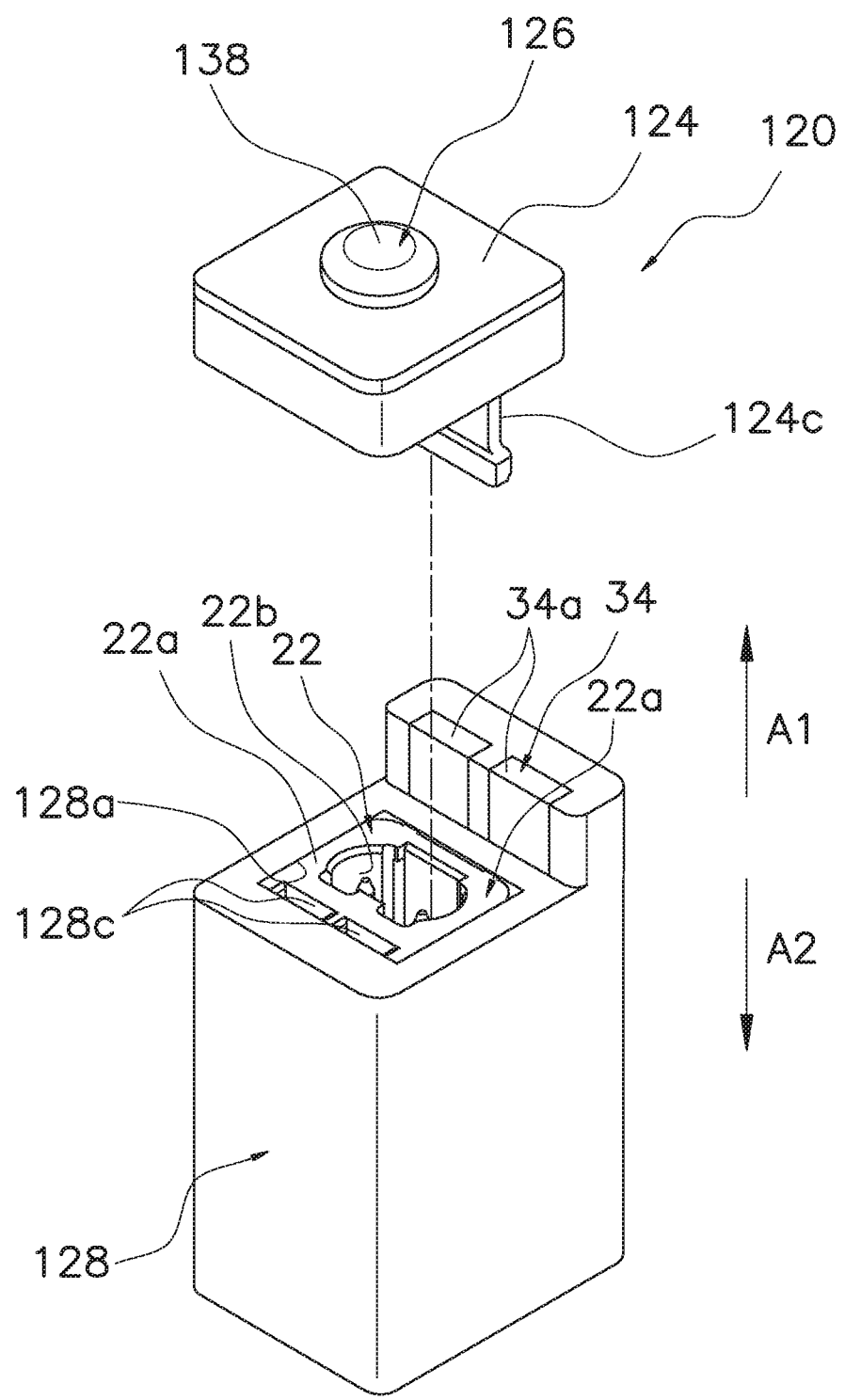
FIG. 9 is an exploded perspective view of the bicycle component according to the second embodiment.
Figure 10:
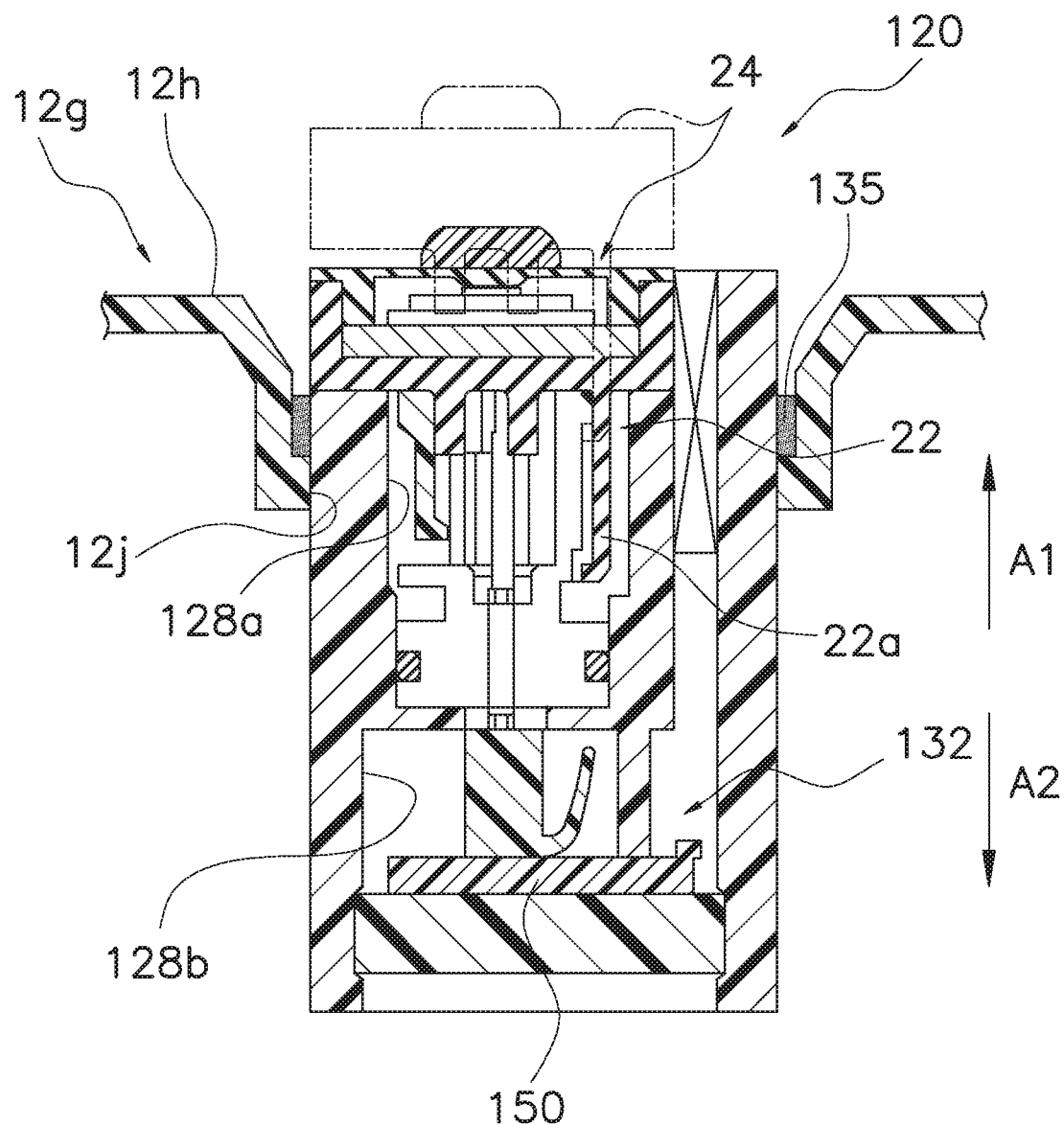
FIG. 10 is a cross-sectional view taken along the section line V-V in FIG. 8.

The lid part 24 and the socket 22a of the receiving part 22 of the second embodiment shown in FIG. 9 are disposed rotated clockwise 90 degrees from the lid part 24 and the socket 22a of the receiving part 22 of the first embodiment shown in FIG. 4. Accordingly, as shown in FIG. 9, the leg portion 24c of the lid part 24 is disposed on the display unit 34 side. Otherwise, the receiving part 22 and the lid part 24 have the same configuration as the first embodiment.

The support portion 128 has substantially the same configuration as the support portion 28 of the first embodiment shown in FIG. 6. However, as described above, the arrangement of the first space 128a that houses the receiving part 22 and the second space 128b that houses the output unit 132 is different from that of the corresponding first space 28a and second space 28b of the first embodiment. Moreover, as in the first embodiment, the leg portion 24c of the lid part 24 can be movably supported in a recess 128c of the support portion 128 in the second embodiment as well. In this case, the recess 128c can be considered as the supporting structure 22d.

The output unit 132 comprises a switch signal generating substrate 150, a power line communication substrate and at least one output terminal 54. The switch signal generating substrate 150 is disposed in the second space 128b of the support portion 128. The power line communication substrate is provided inside a control case 142 provided separately from the support portion 128. As in the first embodiment, the output unit 132 comprises two output terminals 54 in the second embodiment as well, but is not limited thereto, and can comprise one, or three or more output terminals 54.

Third Embodiment

Figure 11:
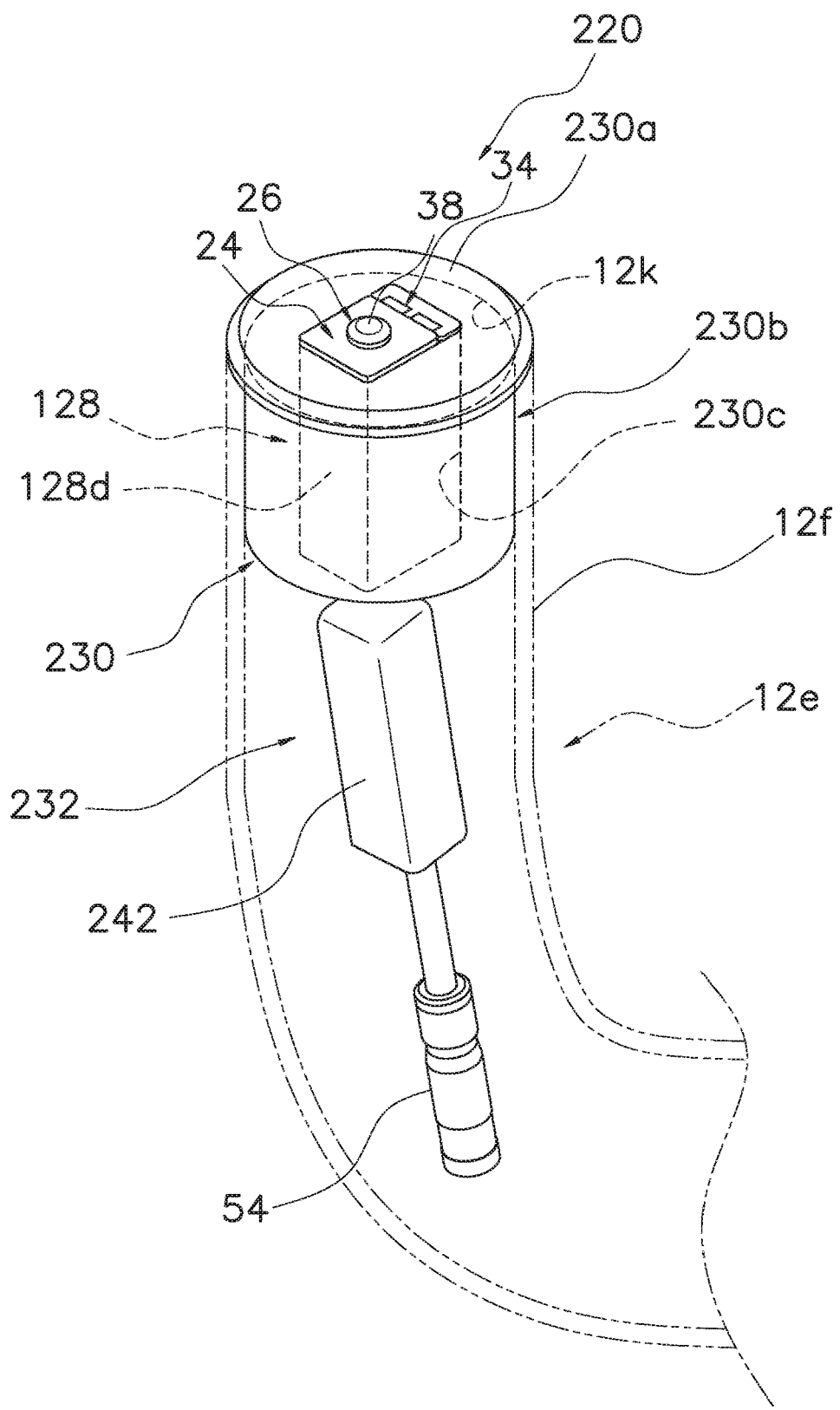
FIG. 11 is a perspective view showing a state in which the bicycle component according to the third embodiment is mounted on a bicycle body.

Next, the third embodiment of the present invention will be described with reference to FIG. 11. A component 220 according to the third embodiment shown in FIG. 11 has the same configuration as the component 120 of the second embodiment except for the output unit 232 and the attaching portion 230. Therefore, in the following description, the configurations of the attaching portion 230 and the output unit 232 will be described. Moreover, in FIG. 11, the handlebar 12e is indicated by a chain double-dashed line.

The bicycle component 220 according to the third embodiment is attached to an attaching recess 12k formed at the distal end of the curved portion 12f of the handlebar 12e. In the third embodiment, the attaching recess 12k is circular. At least a portion of the attaching portion 230 is disposed inside the handlebar 12e. The attaching portion 230 is fixed to the attaching recess 12k by, for example, adhesion. The attaching portion 230 comprises a disk-shaped flange 230a and a cylindrical main body portion 230b, which is attached to the attaching recess 12k. The outer diameter of the flange 230a is the same as or smaller than the outer diameter of the handlebar 12e. The main body portion 230b comprises a shape that fits the attaching recess 12k. A space 230c with a rectangular cross section is formed in the main body portion 230b. The space 230c engages with the outer side surface 128d of the support portion 128. The lid part 24 is disposed slightly protruding from the flange 230a. Moreover, as in the second embodiment, the leg portion 24c of the lid part 24 can be movably supported in the recess 128c of the support portion 128 in the third embodiment as well. In this case, the recess 128c can be considered as the supporting structure 22d.

The output unit 232 comprises a switch signal generating substrate, a power line communication substrate and at least one output terminal 54. The switch signal generating substrate is disposed in the second space 128b of the support portion 128. The power line communication substrate is provided inside a control case 242 provided separately from the support portion 128. In the third embodiment, the output unit 232 comprises a single output terminal 54, but is not limited thereto, and can also comprise two or more output terminals 54.

Other Embodiments

While several embodiments were described above, but the present invention is not limited to the above-described embodiments, and various modifications can be made without departing from the scope of the invention. Specifically, the various embodiments and modified examples described in the present specification can be freely combined according to necessity.

(a) In the above-described embodiments, an example was shown in which the bicycle components 20, 120 and 220 carry out wired communications with additional bicycle components via output units 32, 132 and 232, respectively, but the invention is not limited thereto. The output units 32, 132 and 232 can comprise a wireless communication unit which can execute at least one of wireless transmissions and wireless receptions, and the bicycle components can carry out wireless communications with the additional bicycle components therewith. In this case, the bicycle components can carry out wireless communications with some or all of the additional bicycle components.

(b) In the above-described embodiments, the bicycle components 20, 120 and 220 are connected to external devices via the electrical connector 18, but the present invention is not limited thereto. Specifically, the receiving part 22 of the bicycle components 20, 120 and 220 can comprise a wireless communication unit that can execute at least one of wireless transmission and wireless reception, and can wirelessly communicate with an external device.

(c) In the above-described embodiment, the bicycle components 20, 120 are disposed on the downtube 12g of the frame 12a, and the bicycle component 220 is attached to the handlebar 12e, but the present invention is not limited thereto. The bicycle components 20, 120 and 220 can be attached to any location on the bicycle body 12. Specifically, the bicycle components 20, 120 and 220 can be attached to any part of the front fork 12b, the seat post 12c, and the handle stem 12d.

(d) In the above-described embodiment, the bicycle components 20 and 120 comprise the receiving part 22, the lid part 24, the electrical operating unit 26, the attaching portion 30, the output unit 32, the display unit 34 and the sealing structure 35, but are not limited thereto, and can comprise only the attaching portion 30, the output unit 32 and the sealing structure 35. In this case, by providing a plurality of output terminals 54 to the output unit 32, the bicycle components 20 and 120 act as electrical distributors that can be attached to the bicycle body 12.

(e) In the above-described embodiment, the bicycle component 20 is attached to the attaching recess 12i by the attaching portion 30 and the sealing structure 35 which is a synthetic resin elastic body comprising synthetic rubber, in which an adhesive layer having adhesiveness is formed on both surfaces thereof, but the invention is not limited thereto. A modified example of the first embodiment will be described with reference to FIGS. 12 to 14.

Figure 12:
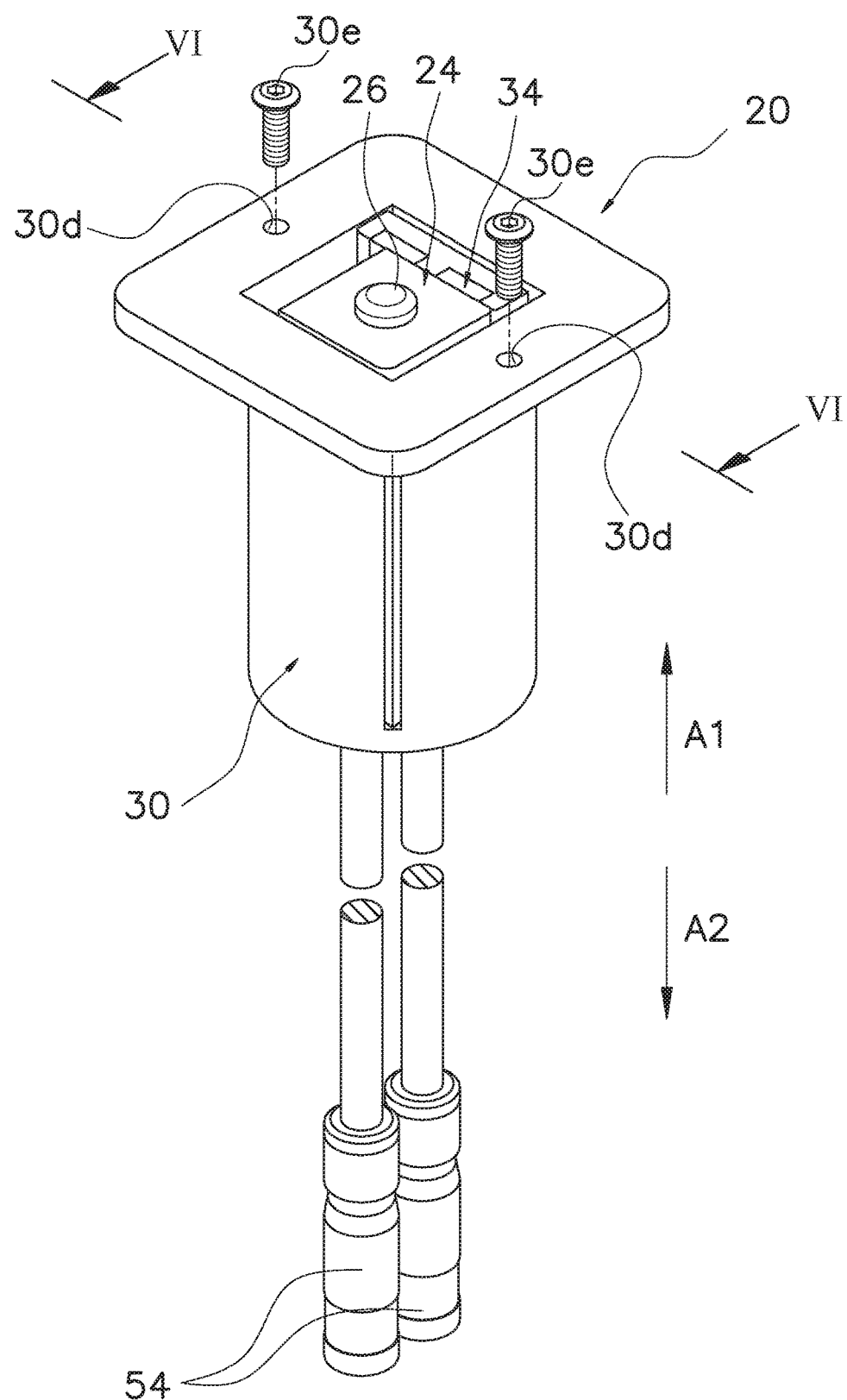
FIG. 12 is a perspective view showing a state in which the bicycle component according to a modified example of the first embodiment is mounted on a bicycle body.
Figure 13:
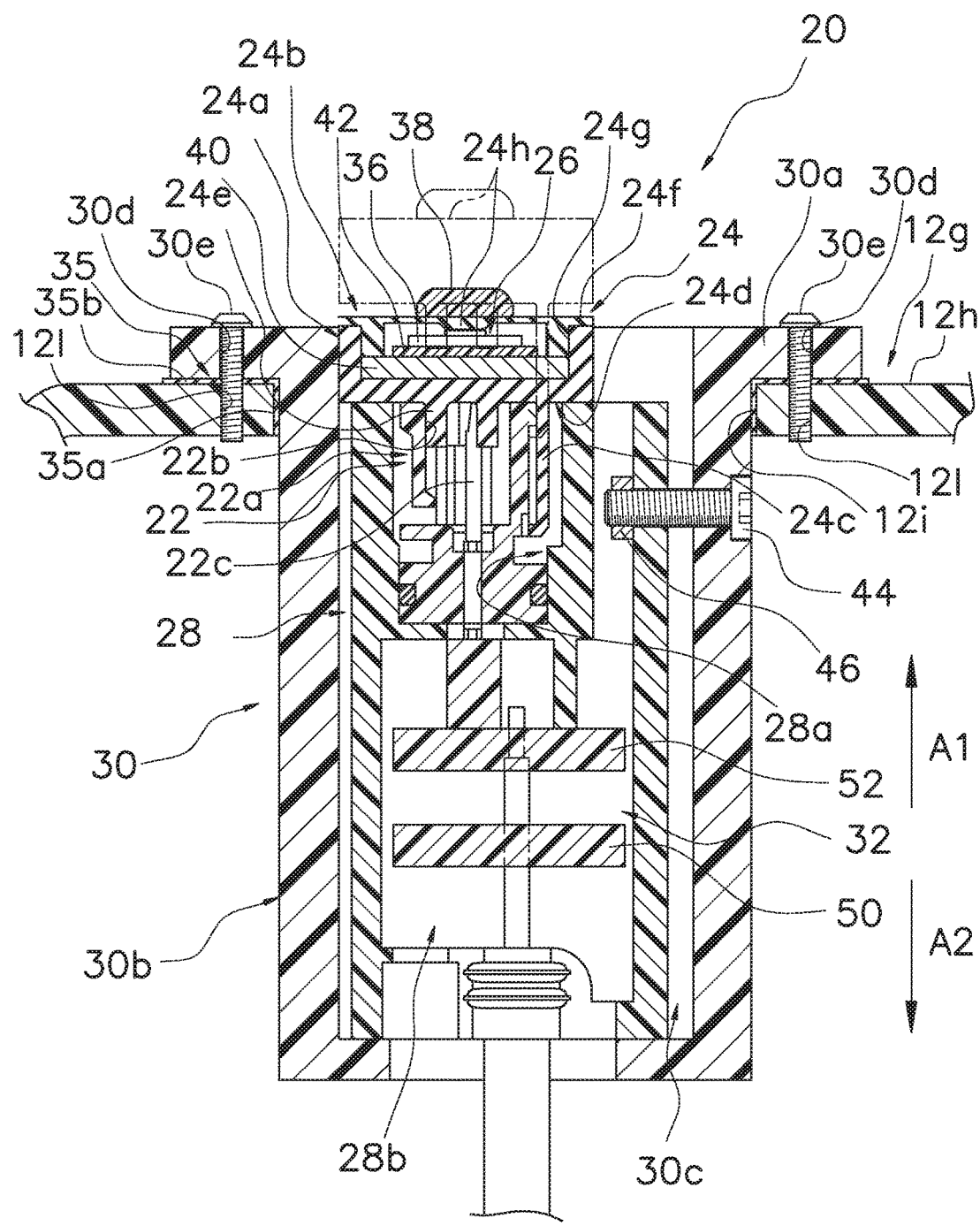
FIG. 13 is a cross-sectional view taken along the section line VI-VI in FIG. 12 according to a first specific example of the modified example.
Figure 14:
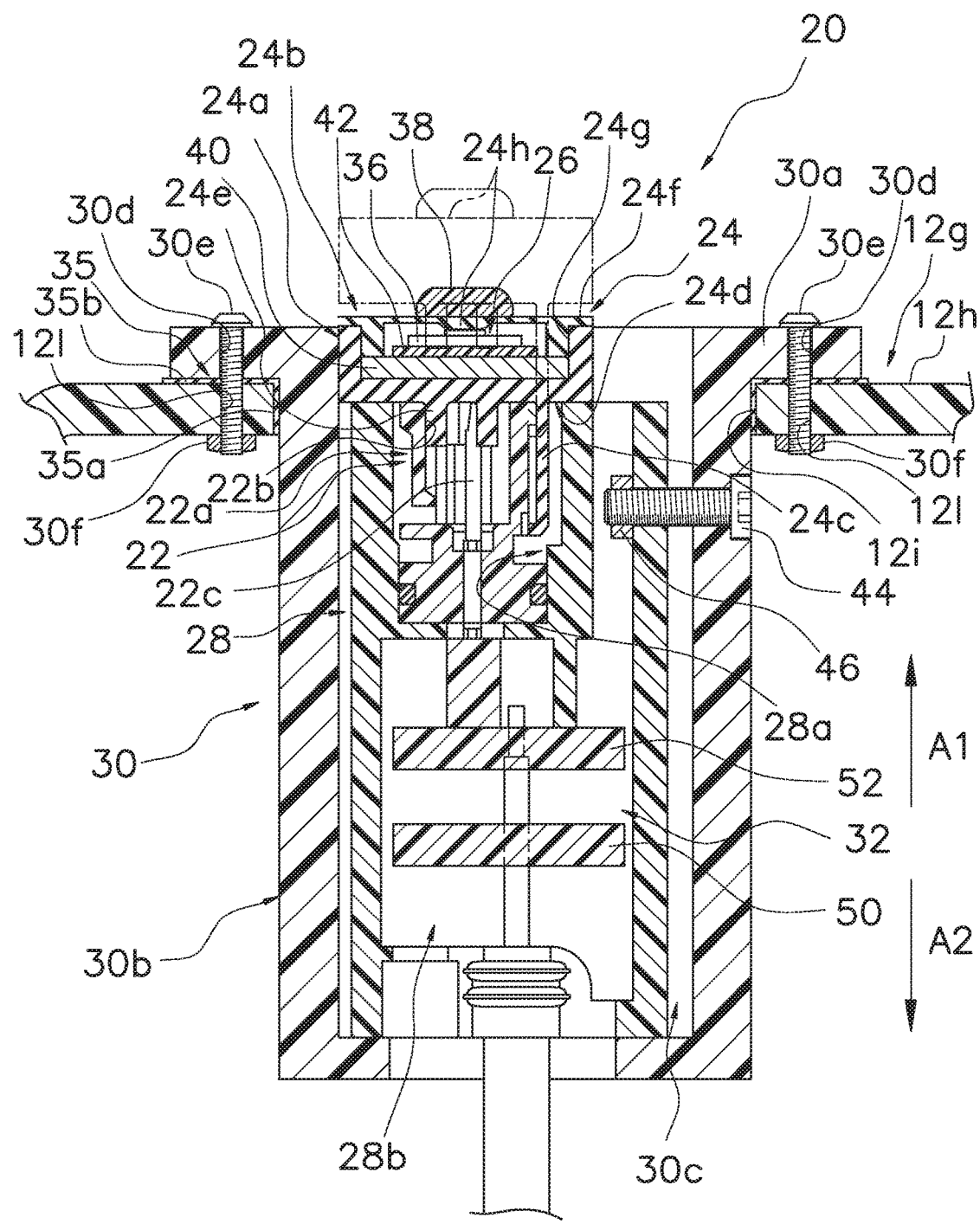
FIG. 14 is a cross-sectional view taken along the section line V in FIG. 12 according to a second specific example of the modified example.

As shown in FIG. 12, in the present modified example, the attaching portion 30 comprises at least one first mounting hole 30d and at least one attaching member 30e. Furthermore, as shown in FIGS. 13 and 14, at least one second mounting hole 12l is formed in the bicycle body 12 (downtube 12g). At least one first mounting hole 30d and at least one second mounting hole 12l are each configured to be capable of receiving at least one attaching member 30e. At least one attaching member 30e is a screw member that is configured to be insertable into the at least one first mounting hole 30d and the at least one second mounting hole 12l. In the present modified example, the attaching portion 30 comprises two of the first mounting holes 30d and two of the attaching members 30e, and two of the second mounting holes 12l are formed in the bicycle body 12 (downtube 12g). When the attaching portion 30 is fixed to the bicycle body 12 (downtube 12g), the central axis of the corresponding first mounting hole 30d and the central axis of the second mounting hole 12l become coaxial.

The fixing method of the attaching portion 30 will be described below, using a first specific example and a second specific example. In the first specific example, screw grooves are formed on the inner peripheral surface of the second mounting hole 12l, or, on the inner peripheral surfaces of the first mounting hole 30d and the second mounting hole 12l, and the attaching portion 30 is fixed to the bicycle body 12 (downtube 12g) by the attaching member 30e which is a screw member that screws into the threaded groove of the second mounting hole 12l, or, the threaded grooves of the first mounting hole 30d and the second mounting hole 12l. Next, as shown in FIG. 14, in the second specific example, at least one screwing member 30f is disposed in an internal space of the bicycle body 1 (downtube 12g). The at least one screwing member 30f is a screw member which can be screwed to the attaching member 30e. Specifically, the screwing member 30f is a nut member. In the second specific example, two of the screwing members 30f are disposed in the internal space of the bicycle body 12 (downtube 12g). The attaching portion 30 is fixed to the bicycle body 12 (downtube 12g) by the attaching member 30e and the screwing member 30f. Therefore, in the second specific example, threaded grooves can or cannot be formed on the inner peripheral surface of the first mounting hole 30d, or, of the first mounting hole 30d and the second mounting hole 12l.

In the present modified example, the sealing structure 35 can be configured to have only the function to seal the gap between the attaching portion 30 and the attaching recess 12i.

In understanding the scope of the present invention, the term "comprising" and its derivatives, as used herein, are intended to be open ended terms that specify the presence of the stated features, elements, components, groups, integers, and/or steps, but do not exclude the presence of other unstated features, elements, components, groups, integers and/or steps. The foregoing also applies to words having similar meanings such as the terms, "including", "having" and their derivatives. Also, the terms "part," "section," "portion," "member" or "element" when used in the singular can have the dual meaning of a single part or a plurality of parts unless otherwise stated.

As used herein, the following directional terms "frame facing side", "non-frame facing side", "forward", "rearward", "front", "rear", "up", "down", "above", "below", "upward", "downward", "top", "bottom", "side", "vertical", "horizontal", "perpendicular" and "transverse" as well as any other similar directional terms refer to those directions of a bicycle in an upright, riding position and equipped with the bicycle component. Accordingly, these directional terms, as utilized to describe the bicycle component should be interpreted relative to a bicycle in an upright riding position on a horizontal surface and that is equipped with the bicycle component. The terms "left" and "right" are used to indicate the "right" when referencing from the right side as viewed from the rear of the bicycle, and the "left" when referencing from the left side as viewed from the rear of the bicycle.

Also it will be understood that although the terms "first" and "second" may be used herein to describe various components these components should not be limited by these terms. These terms are only used to distinguish one component from another. Thus, for example, a first component discussed above could be termed a second component and vice versa without departing from the teachings of the present invention. The term "attached" or "attaching", as used herein, encompasses configurations in which an element is directly secured to another element by affixing the element directly to the other element; configurations in which the element is indirectly secured to the other element by affixing the element to the intermediate member(s) which in turn are affixed to the other element; and configurations in which one element is integral with another element, i.e. one element is essentially part of the other element. This definition also applies to words of similar meaning, for example, "joined", "connected", "coupled", "mounted", "bonded", "fixed" and their derivatives. Finally, terms of degree such as "substantially", "about" and "approximately" as used herein mean an amount of deviation of the modified term such that the end result is not significantly changed.

While only selected embodiments have been chosen to illustrate the present invention, it will be apparent to those skilled in the art from this disclosure that various changes and modifications can be made herein without departing from the scope of the invention as defined in the appended claims. For example, unless specifically stated otherwise, the size, shape, location or orientation of the various components can be changed as needed and/or desired so long as the changes do not substantially affect their intended function. Unless specifically stated otherwise, components that are shown directly connected or contacting each other can have intermediate structures disposed between them so long as the changes do not substantially affect their intended function. The functions of one element can be performed by two, and vice versa unless specifically stated otherwise. The structures and functions of one embodiment can be adopted in another embodiment. It is not necessary for all advantages to be present in a particular embodiment at the same time. Every feature which is unique from the prior art, alone or in combination with other features, also should be considered a separate description of further inventions by the applicant, including the structural and/or functional concepts embodied by such feature(s). Thus, the foregoing descriptions of the embodiments according to the present invention are provided for illustration only, and not for the purpose of limiting the invention as defined by the appended claims and their equivalents.

What is claimed is:

1. A bicycle component, comprising:
   a receiving part including an opening configured to receive an electrical connector;
   a lid part configured to cover at least a part of the opening;
   an electrical operating unit being provided to the lid part; and
   an attaching portion to be attached to an attaching recess of a bicycle body.

2. The bicycle component according to claim 1, wherein the electrical connector includes a plug, and
   the receiving part includes a socket configured to be electrically connected to the plug.

3. The bicycle component according to claim 1, wherein the electrical operating unit includes at least one switch configured to be pressed.

4. The bicycle component according to claim 3, wherein the electrical operating unit includes an installation part in which the at least one switch is installed.

5. The bicycle component according to claim 3, wherein the electrical operating unit includes at least one pressing portion to press the at least one switch.

6. The bicycle component according to claim 5, wherein the at least one pressing portion is disposed on an exterior surface of the lid part, and the at least one switch is disposed in an interior space of the lid part.

7. The bicycle component according to claim 1, wherein the lid part is configured to be disposed in a first position and in a second position which is different from the first position, and
   a part of the opening of the receiving part is configured to be covered by the lid part when the lid part is disposed in the first position, and
   the receiving part receives the electrical connector via the opening when the lid part is disposed in the second position.

8. The bicycle component according to claim 7, wherein the lid part includes a sealing portion configured to seal the opening.

9. The bicycle component according to claim 8, wherein the sealing portion of the lid part is configured to seal the opening when the lid part is disposed in the first position.

10. The bicycle component according to claim 1, further comprises
    a supporting structure to movably support the lid part.

11. The bicycle component according to claim 1, wherein the lid part is made of an elastic material.

12. The bicycle component according to claim 1, wherein the lid part is made of non-metallic material.

13. The bicycle component according to claim 1, further comprises
    a sealing structure configured to seal a gap between the attaching recess and the attaching portion.

14. The bicycle component according to claim 13, wherein
    the sealing structure is arranged on the attaching portion.

15. The bicycle component according to claim 1, wherein the attaching recess is arranged in a hollow member of the bicycle body, and
    at least a portion of the attaching portion is disposed in an interior space of the hollow member of the bicycle body.

16. The bicycle component according to claim 1, wherein the attaching recess is disposed in at least one of a handlebar and a frame, which is the hollow member, and
    at least a portion of the attaching portion is disposed in interior space of at least one of the frame and the handlebar.

17. The bicycle component according to claim 1, wherein the attaching portion being attached to the attaching recess by at least one attaching means from among locking, press fitting, adhesion, snap fitting and screwing.

18. The bicycle component according to claim 1, further comprises
a display unit configured to display an operating state.

19. A bicycle component configured to be attached to a bicycle body, the bicycle component comprising:
a receiving part including an opening configured to receive an electrical connector;
a lid part configured to cover at least a part of the opening;
an electrical operating unit being provided to the lid part; and
an output unit configured to be electrically connected to the electrical operating unit and the receiving part, and being further configured to output a mode transition signal to an additional bicycle component upon receiving an input from the electrical operating unit.

20. The bicycle component according to claim 19, wherein
the receiving part is configured to receive a signal via the electrical connector, and
the output unit outputs the signal from the receiving part to the additional bicycle component.

21. The bicycle component according to claim 20, wherein
the additional bicycle component is a bicycle shifting device.

22. The bicycle component according to claim 19, wherein
the receiving part is configured to receive power via the electrical connector, and
the output unit is further configured to output power from the receiving part to an additional bicycle component.

23. The bicycle component according to claim 22, wherein
the additional bicycle component includes a bicycle rechargeable power supply device.

24. A bicycle component configured to be attached to a bicycle body, the bicycle component comprising:
a receiving part including an opening configured to receive an electrical connector;
a lid part configured to cover at least a part of the opening;
an electrical operating unit being provided to the lid part; and
a wireless communication unit configured to execute at least one of wireless transmission and wireless reception.

25. The bicycle component according to claim 19, wherein
the output unit is configured to output a mode transition signal to the additional bicycle component upon receiving an input from the electrical operating unit.

* * * * *